US008891725B2

(12) United States Patent
Terrovitis (10) Patent No.: US 8,891,725 B2
(45) Date of Patent: Nov. 18, 2014

(54) FREQUENCY DIVIDER WITH IMPROVED LINEARITY FOR A FRACTIONAL-N SYNTHESIZER USING A MULTI-MODULUS PRESCALER

(71) Applicant: QUALCOMM Incorporated, San Diego, CA (US)

(72) Inventor: Emmanouil Terrovitis, Foster City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 25 days.

(21) Appl. No.: 13/872,367

(22) Filed: Apr. 29, 2013

(65) Prior Publication Data

US 2014/0003570 A1  Jan. 2, 2014

Related U.S. Application Data (60) Provisional application No. 61/775,986, filed on Mar. 11, 2013, provisional application No. 61/667,378, filed on Jul. 2, 2012.

(51) Int. Cl.
*H03K 21/00* (2006.01)
*H03L 7/197* (2006.01)
*H03K 23/00* (2006.01)

(52) U.S. Cl.
CPC ............ *H03K 23/002* (2013.01); *H03L 7/1976* (2013.01)
USPC ............................................... 377/47; 377/48

(58) Field of Classification Search
None
See application file for complete search history.

(56) References Cited

U.S. PATENT DOCUMENTS

| 5,414,391 | A | 5/1995 | Hori |
| 5,640,116 | A | 6/1997 | Kobayashi et al. |
| 6,108,393 | A * | 8/2000 | Opsahl ............................ 377/47 |
| 6,952,121 | B1 | 10/2005 | Vu |
| 7,564,276 | B2 * | 7/2009 | Narathong et al. ........... 327/117 |
| 7,620,140 | B2 * | 11/2009 | Chiu et al. ...................... 377/47 |
| 8,218,712 | B1 | 7/2012 | Jiang et al. |

(Continued)

FOREIGN PATENT DOCUMENTS

| EP | 2187524 A1 | 5/2010 |
| KR | 20110064073 A | 6/2011 |
| WO | 8203477 A1 | 10/1982 |
| WO | 2005099095 A1 | 10/2005 |

OTHER PUBLICATIONS

International Search Report and Written Opinion—PCT/US2013/046920—ISAEPO—Sep. 3, 2013.

(Continued)

*Primary Examiner* — Tuan T Lam
(74) *Attorney, Agent, or Firm* — Mahamedi Paradice LLP (57) ABSTRACT

A frequency divider is disclosed. The frequency divider includes a multi-modulus prescaler to perform a frequency division by a modulus M, wherein M is an integer between N and 2*N−1 and N is a power of 2. The frequency divider also includes a programmable counter to output the digital representation of M and an output clock signal. For the frequency divider, M equals N plus D minus D\N for each edge of the multi-modulus prescaler output clock CKpr wherein the counter samples the digital representation of D and D\N denotes an integer part of D divided by N, and M equals N for each subsequent edge of the prescaler output clock CKpr wherein the counter does not sample the digital representation of D.

39 Claims, 7 Drawing Sheets

(56) References Cited

U.S. PATENT DOCUMENTS

| | | | |
|---|---|---|---|
| 8,406,371 B1* | 3/2013 | Barale et al. | 377/47 |
| 8,552,770 B2* | 10/2013 | Cavin | 327/115 |
| 8,599,997 B2* | 12/2013 | Chen et al. | 377/47 |
| 8,675,810 B2* | 3/2014 | Martin | 377/47 |
| 2002/0163389 A1 | 11/2002 | Jun et al. | |
| 2004/0202275 A1* | 10/2004 | Wang | 377/47 |
| 2007/0147571 A1* | 6/2007 | Yu et al. | 377/47 |
| 2009/0213980 A1* | 8/2009 | Ding et al. | 377/48 |
| 2011/0150168 A1* | 6/2011 | Tseng et al. | 377/47 |

OTHER PUBLICATIONS

Kenny, T.P., et al., "Design and Realization of a Digital Modulator for Fractional-Frequency Synthesis", IEEE Transactions on Vehicular Technology, IEEE Service Center, Piscataway, NJ, US, vol. 48, No. 2, Mar. 1, 1999, XP011063829, ISSN: 0018-9545, figure 2.

Vaucher, Cicero S. et al, "A Family of Low-Power Truly Modular Programmable Dividers in Standard 0.35-pm CMOS Technology", IEEE Journal of Solid-state Circuits, Jul. 2000, pp. 1039-1045, vol. 35, No. 7.

* cited by examiner

FREQUENCY DIVIDER WITH IMPROVED LINEARITY FOR A FRACTIONAL-N SYNTHESIZER USING A MULTI-MODULUS PRESCALER

RELATED APPLICATIONS

This application claims priority to U.S. Provisional Patent Application No. 61/667,378, titled "Frequency Divider With Improved Linearity For A Fractional-N Synthesizer Using A Multi-Modulus Prescaler," filed Jul. 2, 2012, and to U.S. Provisional Patent Application No. 61/775,986, titled "Frequency Divider With Improved Linearity For A Fractional-N Synthesizer Using A Multi-Modulus Prescaler", filed Mar. 11, 2013, each of which is hereby incorporated by reference in its entirety.

TECHNICAL FIELD

The disclosure herein relates generally to frequency synthesizers and associated methods, and more particularly to fractional-N synthesizers.

BACKGROUND OF RELATED ART

Fractional-N frequency synthesizers are phase-locked-loops (PLL) capable of generating output signals having frequencies that can be a non-integer multiple of a reference frequency. One popular technique involves digital encoding such as sigma-delta modulation and is commonly referred to as sigma-delta ($\Sigma\Delta$) fractional-N synthesis.

Figure 1:
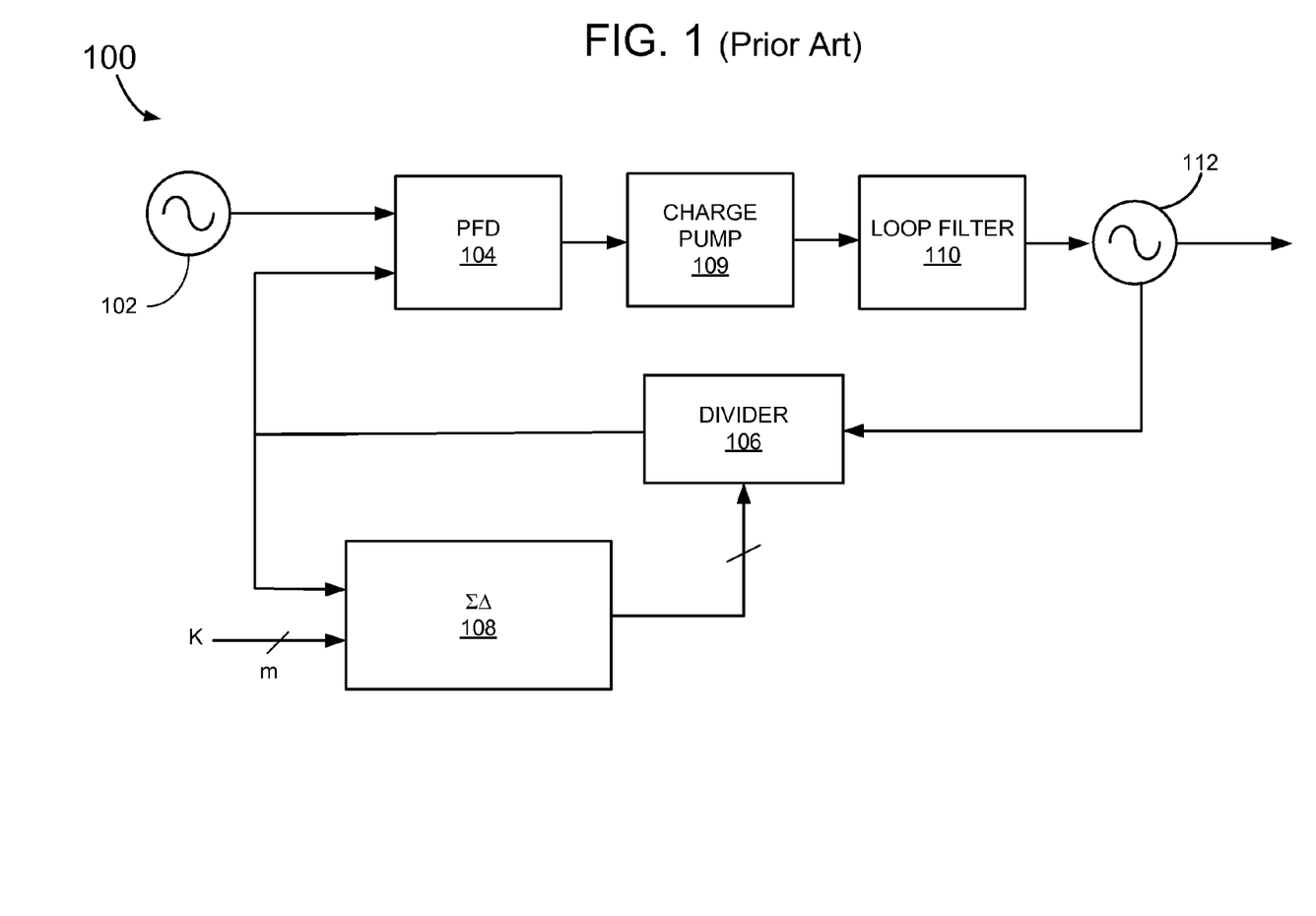
FIG. 1 is a block diagram of a conventional sigma-delta fractional-N synthesis circuit.

FIG. 1 illustrates a high-level block diagram of a conventional sigma-delta fractional-N synthesis circuit 100. The circuit generally takes the form of a PLL that employs an input reference signal source 102 having a frequency Fref that is fed to one input of a phase frequency detector 104. A second input of the detector receives a signal from a frequency divider 106. The divider responds to control signals generated by a sigma-delta modulator 108 and also receives the output signal Fout from a voltage-controlled oscillator VCO 112 that modifies it's output based on the level of error in the output of the phase detector 104 and a charge pump 109. A loop filter 110 removes the high frequency noise generated as the sigma-delta modulator randomizes spurious energy.

Figure 2:
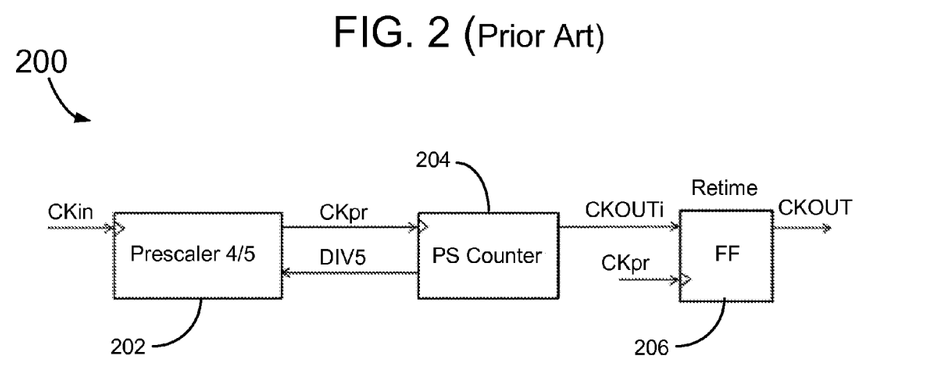
FIG. 2 illustrates a conventional frequency divider employed by the synthesis circuit of FIG. 1.

FIG. 2 shows a commonly used frequency divider topology 200, that includes a dual modulus prescaler 202. The dual modulus prescaler is a programmable frequency divider that can divide an input signal of a given frequency by an integer N or N+1, where for ease of implementation, N is usually a power of 2. In the example of FIG. 2, N is 4. The input of the prescaler 202 CKin is connected to a high frequency periodic source which is usually the VCO, assumed in this example to run at approximately 4 GHz. The prescaler 202 generates an output CKpr that is connected to a programmable counter 204. With a divisor of N=4, the output CKOUTi is generally a signal exhibiting a frequency of 1 GHz.

The programmable counter 204 is programmed by two integer parameters P and S. P represents the total number of pulses of signal CKpr in one division cycle. At the end of every division cycle, the PS counter asserts an output signal pulse CKOUTi. During S of these P cycles, the PS Counter 204 programs the prescaler 202 to divide by N+1 (or 5 in this example) by asserting an appropriate control signal called DIV5. During the remaining (P−S) pulses the prescaler divides the input clock by N (4 in this case). Finally, the total number of pulses of the high frequency source (VCO pulses) in a division cycle is S(N+1)+(P−S)*N=N*P+S Any division ratio N*P+S greater than N*(N+1) is achievable by selecting appropriate values of P and S. The programmed value of S is between 0 and N−1. The output of the PS counter 204 CKOUTi can be retimed by a flip-flop element 208 that is clocked by CKpr to generate a cleaner output CKOUT, thus eliminating the noise introduced by the PS counter. Signal CKOUT is signal CKOUTi delayed by one period of clock CKpr. Clock CKOUT is the feedback clock connected the second input of the phase frequency detector 104 of FIG. 1.

Figure 3:
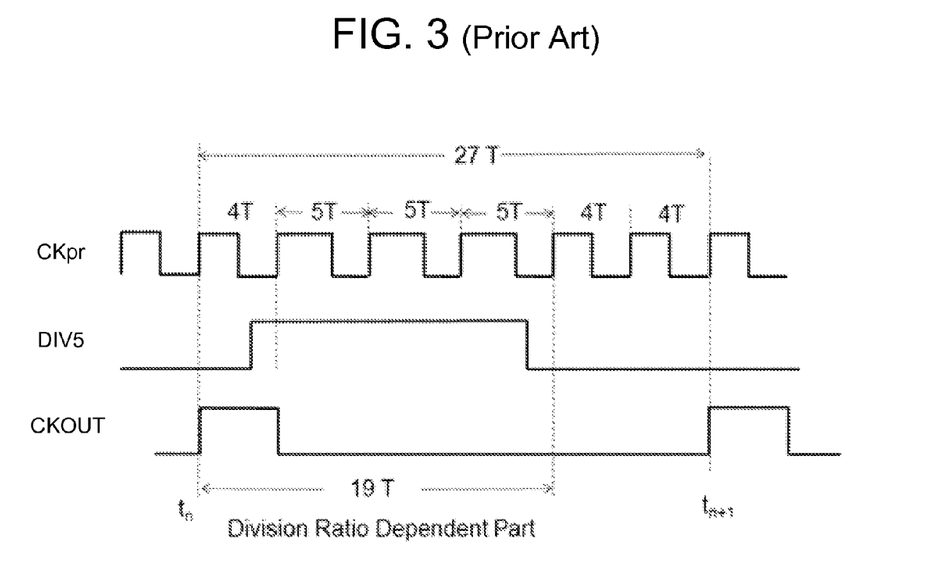
FIG. 3 shows a possible relative timing for various signals associated with the frequency divider of FIG. 2.

FIG. 3 shows a timing chart that illustrates the various timing relationships between signals CKpr, DIV5 and CKOUT for an example division of 27. In this case N=4, S=3 and P=6. The PS counter 204 is clocked by the rising edge of CKpr. With the rising edge of the clock at time $t_n$, the CKOUT signal of the previous cycle is generated. The programmed P and S values are sampled by the PS counter 204 at the same time. The DIV5 signal is read by the prescaler 202 at every rising edge of the prescaler output CKpr and the prescaler functions accordingly during this period dividing by 4 or 5 until the next rising edge of CKpr when DIV5 is sampled again. Since the values of P and S are unknown before $t_n$ and S=0 is a possibility, the DIV5 signal is always low in the first period of CKpr after $t_n$ and the prescaler always divides by 4. Based on the value of S, the prescaler 202 divides the high frequency input clock signal by 5 for the next 0 to 3 periods.

While the conventional topologies and methods described above work well for their intended applications, the division ratio of the frequency divider 106 is modulated by the output of the sigma-delta modulator 108 and is different in every cycle. Because of the different switching patterns, different disturbances on the power supply or other relatively slow nodes inside the divider can result in different delays in the feedback signal. This modulated delay is undesirable because it creates nonlinearity in the sigma delta modulation and can fold high frequency quantization noise inside the loop bandwidth. This effect often results in degraded overall noise performance for the synthesizer.

SUMMARY

The present disclosure describes a frequency divider dividing by an integer D the frequency of its input clock. The frequency divider includes a multi-modulus prescaler to perform a frequency division by a modulus M, wherein M is an integer between N and 2*N−1 and N is a power of 2. The frequency divider also includes a programmable counter to output the digital representation of M and an output clock signal, wherein: M equals N plus D minus D\N for each edge of an intermediate clock CKpr wherein the counter samples the digital representation of D; and M equals N for each subsequent edge of the intermediate clock CKpr wherein the counter does not sample the digital representation of D.

For example, one embodiment is a frequency divider for dividing a frequency of an oscillation signal, comprising: a first input to receive an input clock signal CKin; a second input to receive a digital representation of a frequency division ratio D, wherein D is an integer; and an output to generate an output clock signal CKout. The frequency divider further comprises a multi-modulus prescaler to perform frequency division by a modulus M, wherein M is an integer between N and 2*N−1 and N is a power of 2, wherein: the multi-modulus prescaler to generate a first edge of CKpr triggered by a first edge of CKin; the multi-modulus prescaler to sample the digital representation of M from the second input of the multi-modulus prescaler with each edge of CKin that triggers an edge of CKpr; and the multi-modulus prescaler to use the sampled value of M to generate a second edge of CKpr with the M-th edge of CKin after the first edge of CKin. The frequency divider also comprises a programmable counter, wherein: the counter to generate a first edge of CKouti triggered by a first edge of CKpr; the counter to sample the digital representation of D from the second input of the frequency divider with a first edge of CKpr; the counter to use the sampled value of D to sample the next value of D with an edge of CKpr D\N edges after the first, wherein D\N equals an integer portion of D divided by N; and the counter to output the digital representation of M with each edge of CKpr. For the frequency divider, M equals N plus D minus D\N for each edge of CKpr wherein the counter samples the digital representation of D; and M equals N for each subsequent edge of CKpr wherein the counter does not sample the digital representation of D.

BRIEF DESCRIPTION OF THE DRAWINGS

The present embodiments are illustrated by way of example and are not intended to be limited by the figures of the accompanying drawings.

DETAILED DESCRIPTION

Embodiments of a frequency divider are presented herein. In one embodiment, a frequency divider is disclosed that includes a programmable multi-modulus prescaler, and a counter. The programmable multi-modulus prescaler includes an input to receive a clock signal exhibiting a period T and is responsive to programmed divider modulus values M from N to 2*N−1 to generate a sequence of pulses corresponding to a predetermined programmed divisor value. The sequence of pulses include a single pulse corresponding to a first modulus value within the range of N to 2*N−1 and plural pulses corresponding to modulus value N. The counter includes an input to receive the sequence of pulses and generates a timing signal upon counting a number of pulses corresponding to the programmed divisor value. By handling all the divisor specific operations as early as possible in the division period, and maximizing the time of the divide-by-N pattern in the last part of the division period, any transients related to the divisor specific part have more time to attenuate, thereby minimizing any detrimental impact on signal quality.

For one embodiment, the modulation linearity of the conventional dual modulus prescaler-based divider can be improved as follows. In the conventional divider, P pulses are generated at the output of the dual modulus prescaler in a division period, S of which pulses have a length of (N+1) periods T and P−S pulses have a length of N periods T. The linearity can be improved if a single long pulse with length N+S periods T is generated as early as possible in the division period and all the rest P−1 pulses have a length of N periods T. In other words, all of the S incremental-divide-by-(N+1) pulses are replaced by a single divide-by-(N+S) pulse.

In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scopes all embodiments defined by the appended claims.

Figure 4:
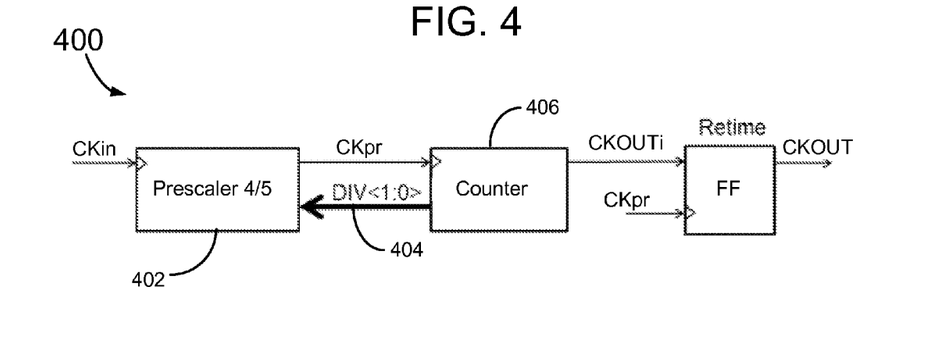
FIG. 4 illustrates one embodiment of a frequency divider that employs a multi-modulus prescaler.

More specifically, and referring generally to FIG. 4, one embodiment of a divider circuit is illustrated, generally designated 400, that is capable of improving modulation linearity. This is accomplished by generating only a single non-divide-by-N pulse during a given pulse sequence for a desired divisor. To generate the single non-divide-by-N pulse, the circuit 400 includes a multi-modulus prescaler 402 capable of dividing by a modulus M, for example, 4, 5, 6 and 7 (in the general case N, N+1, ..., 2*N−1). The multi-modulus prescaler 402 receives an input periodic signal CKin having a period T from, for example, a VCO (not shown) and generates an output signal sequence CKpr.

Further referring to FIG. 4, the prescaler output signal CKpr is fed to a timing input of a programmable counter 406. The counter provides for programmed values for the desired divisor, corresponding to "P" pulses. Thus, once the counter counts "P" pulses (for one embodiment, the rising edge of each pulse), a timing signal CKOUTi is generated at a counter output. In one embodiment, the counter timing signal CKOUTi is retimed by a flip-flop 408 that is clocked by the prescaler output signal CKpr to generate a cleaner timing pulse CKOUT. In one embodiment, the counter is on a supply different than the supply of the prescaler and the retiming flip flop. The supply used for the counter can be noisy because the noise introduced by this supply in the counter is removed by the retiming flip-flop. In addition, in this configuration noise introduced by the counter to its supply does not contaminate the supply of the prescaler and the retiming flip flop.

With continued reference to FIG. 4, the programmable counter provides control bits for specifying the multi-modulus values of the prescaler 402. Since the multi-modulus prescaler provides for selection of more than two modulus values, a corresponding number of control bits is need to be provided to make the selection. Thus, instead of a single bit control signal utilized in conventional counters using dual-modulus prescalers, a control signal that is free to be a multi-bit signal DIV<1:0> (generally of length K=log 2(N)) indicating the value of the modulus M, is transferred along a feedback bus 404 to the prescaler 402. For example, a 2-bit control word may specify up to four modulus values, where a bit sequence of "00" represents a modulus 4, "01" represents a modulus 5, "10" represents a modulus 6, and "11" represents a modulus 7. In one embodiment, the multi-modulus prescaler 402 samples all bits of the control signal DIV<1:0> at the rising edge of each prescaler output pulse CKpr.

Figure 5:
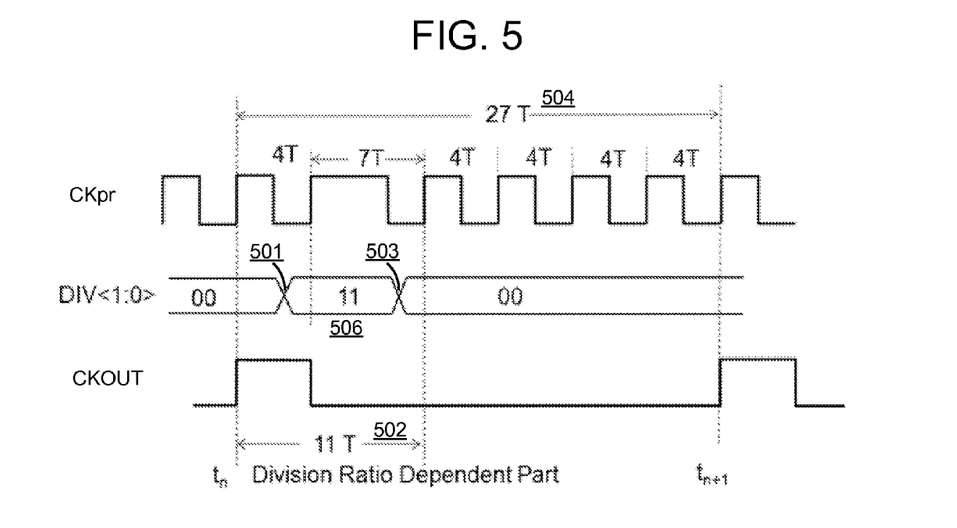
FIG. 5 shows a possible relative timing for various signals associated with the frequency divider of FIG. 4.

FIG. 5 illustrates one specific example of relevant pulse waveforms and associated timings of a pulse sequence generated by the divider of FIG. 4. For this specific example, the programmed divisor ratio is "27", represented by 27 intervals of the VCO period T. To arrive at a sequence of pulses where only one non-divide-by-N pulse is generated, a total of five pulses of period 4T are to be generated, and a single pulse of period 7T is to be generated. In operation, a non-zero control signal DIV<K−1:0> (here bits "11" representing a modulus 7), at 501, is applied during only one cycle of the prescaler output CKpr, such as at 506, as early as possible in the division period 504. Since it is generally undesirable to apply the new and divisor specific modulus to the prescaler before the rising edge of CKOUT is generated, to avoid divisor specific disturbance, the non-divide-by-N value is available to the prescaler with the edge of CKpr following the one that triggers the rising edge of CKOUT. In this embodiment the division ratio of the divider is sampled with the rising edge of CKpr which also generates the rising edge of CKOUT, and the non-divide-by-N modulus is processed and ready to be sampled by the prescaler with the next rising edge of CKpr. The control signal DIV<K−1:0> then returns to "00", at 503, for as long as possible for the last part of the division period. By doing this for all pulse sequences, the last part of all division periods are similarly independent of the divisor. This prevents the prescaler from operating differently during the last part of different division cycles and reduces the introduction of different delays to the counter output signal CKOUT.

Further referring to FIG. 5, with the divider circuit architecture of FIG. 4, the length of a division ratio dependent part, shown at 502 in FIG. 5, of a division period 504, is reduced relative to the corresponding part of FIG. 3 corresponding to the conventional divider from 19 to 11 VCO periods and the length of the second part during which the control signal DIV<1:0> is zero and the prescaler divides continuously by 4 is increased from 8 to 16 VCO periods. This allows any transients related to the ratio-specific portion of the pulse sequence to have more time to attenuate.

Figure 5A:
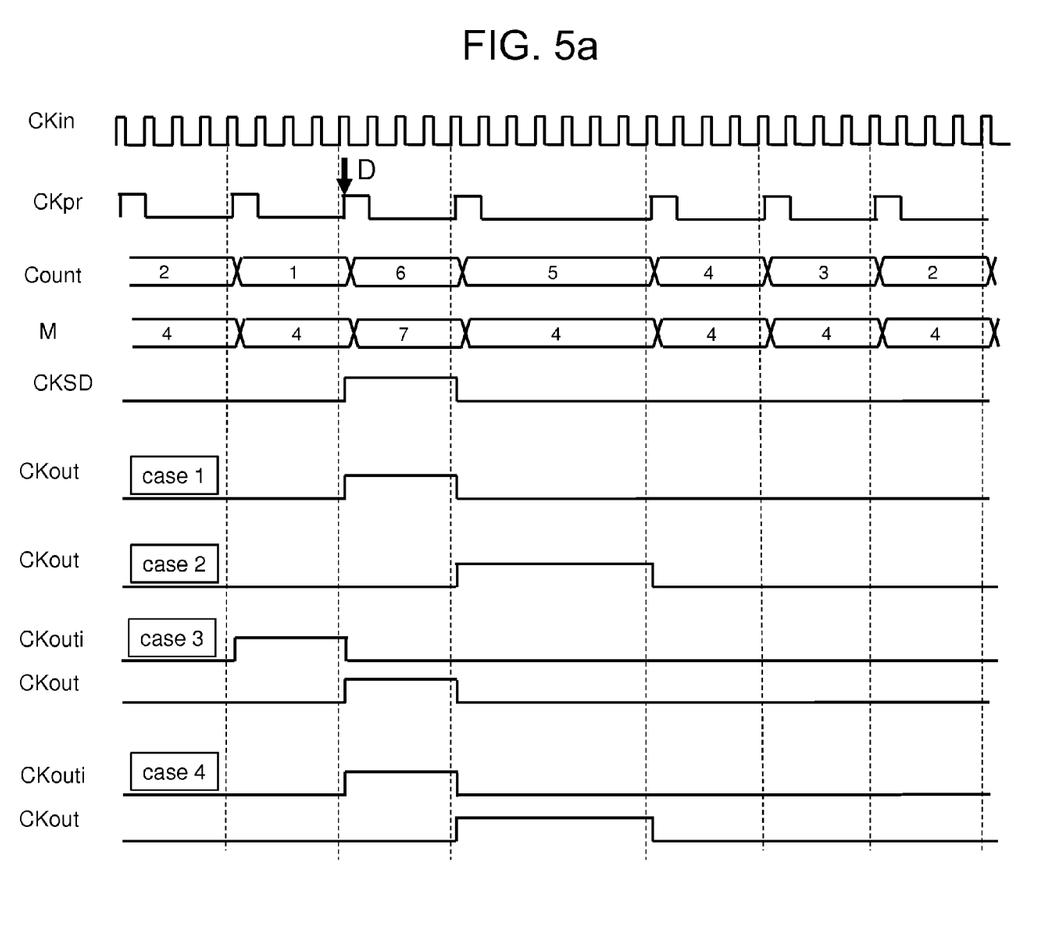
FIG. 5a shows four possible cases for the relative timing of the various signals associated with a frequency divider using a multi-modulus prescaler.

FIG. 5a is a timing diagram illustrating more possible cases for the relative timing of the signals associated with the divider of FIG. 4 based on a multi-modulus prescaler. The prescaler counts pulses of CKin and generates clock CKpr according to the value of the modulus M generated by the counter and sampled by the prescaler by the edges of CKin that generate the edges of CKpr. Signal "Count" is the content of the counter which counts edges of CKpr. The counter starts with the number of periods of CKpr in division cycle and counts down to 1. The number of periods of CKpr in a division cycle is determined by the division ratio D and equals D\N where \ denotes the integer part of D divided by N. D is sampled with the edge of CKpr that appears while Count is 1. The Sigma Delta block may start generating the next division ratio D right after D is read, so the same edge of CKpr may trigger the edge of the Sigma Delta clock CKSD.

Four possible cases for the generation of CKOUT are shown in FIG. 5a. In case 1, there is no retiming flip-flop and the divider output CKOUT is generated directly by the counter with the edge of CKpr that reads D, so CKOUT is generated before M=7 at the prescaler inputs. In case 2, again there is no retiming flip-flip and CKOUT is generated directly by the counter with the edge of CKpr following the edge of CKps that reads D. The advantage in this case is that the long division cycle of the prescaler appears sooner after the CKOUT edge than in case 1 and allows more time to settle until the next edge of CKOUT, but M=7 appears at the input of the prescaler before the CKOUT is generated and may introduce some division ratio specific disturbance to CKOUT. Cases 3 and 4 are similar to cases 1 and 2, respectively, regarding the timing of the edge of CKOUT, but a retiming flip flop is retiming the output of the counter CKOUTi. Hence, CKOUTi may be generated by the counter one period of CKpr before CKOUT.

Figure 6:
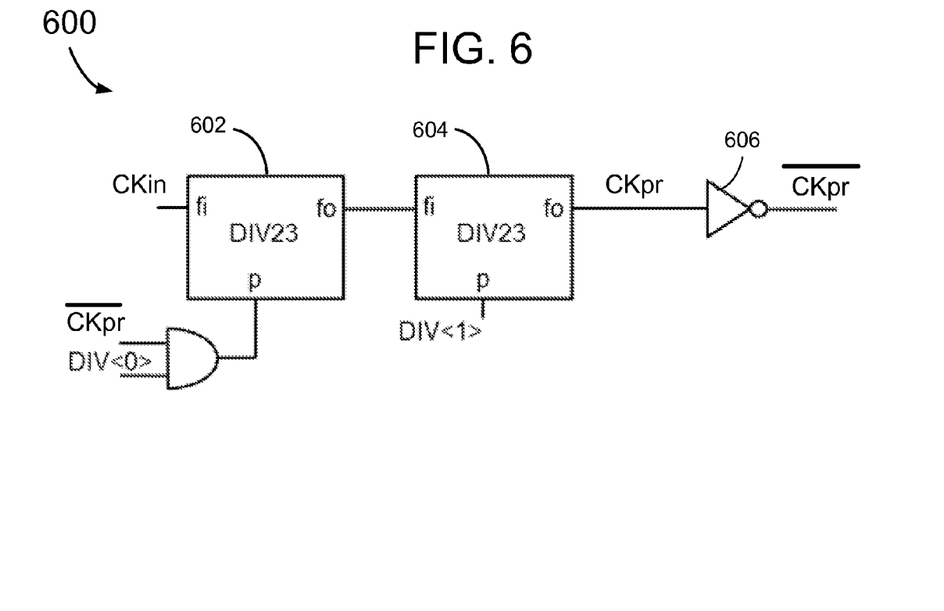
FIG. 6 illustrates further detail associated with one embodiment of the prescaler of FIG. 5.

FIG. 6 illustrates further detail of one specific embodiment of a multi-modulus prescaler, generally designated 600, that incorporates a cascaded pair of programmable divide-by-⅔ circuits 602 and 604. Each of the divider components 602 and 604 include respective clock inputs fi, outputs fo, and control inputs p. For one embodiment, a value of "0" for the input p configures the divider as a divide-by-2 divider, while a control bit value of "1" configures the divider as a divide-by-3 divider. Input p is sampled by the divide-by-⅔ circuit at the rising edge of the output clock fo which acts according to the sampled value until the next rising edge of fo. The first divider component 602 receives a VCO clock signal VCO and a control input p from a logical ANDing of a first control bit DIV<0> and a complement of the multi-modulus prescaler output CKpr. Gating the control signal in this way ensures that a proper rising edge of the output clock of 602 clocks-in the control bit. The control bit DIV<0> is a least-significant-bit (LSB) from a 2-bit control word generated by a programmable counter (not shown).

Further referring to FIG. 6, the output fo of the first programmable divide by ⅔ stage feeds a clock input fi of the second stage 604. The second divider 604 also receives a second control bit DIV<1> of the overall control signal DIV<1:0>. The second control bit, by its state, specifies a modulus value of 2 or 3 applied to the input signal, thereby generating the overall prescaler output CKpr. The control bits DIV<0> and DIV<1> are generated so as to accomplish the desired output results. To generate the output complement/CKpr, an inverter 606 is disposed at the second divider component output.

Figure 7:
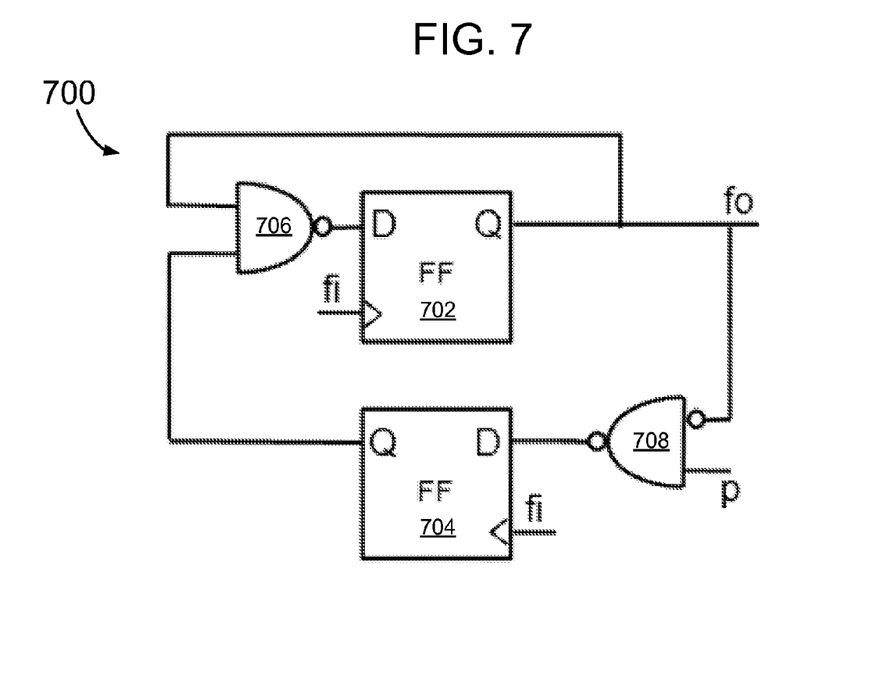
FIG. 7 illustrates further detail associated with one embodiment of the DIV23 circuit of FIG. 6.

FIG. 7 illustrates a commonly used divide-by-⅔ divider, generally designated 700, that corresponds to the divider components 602 and 604 of FIG. 6. The component includes a pair of D flip-flops 702 and 704. The first flip-flop 702 receives a NANDed output of the second flip-flop output Q and its own output Q, and the second flip-flop 704 receives a NANDed output of the first flip-flop output Q (which is also the component output fo) complement and the control signal p. This divide-by-⅔ circuit possess the desirable properties that a) it is sensitive to the rising edge of its input clock, b) it can only sample a nonzero value for its programming input p at the rising edge of its input clock, right before which its output is low (equivalently it can only sample a non-zero input p at the rising edge of its output clock).

In operation, the multi-modulus prescaler 600 enables all of the control bits for the control word to be sampled at the rising edge of the multi-modulus prescaler output CKpr.

Figure 8:
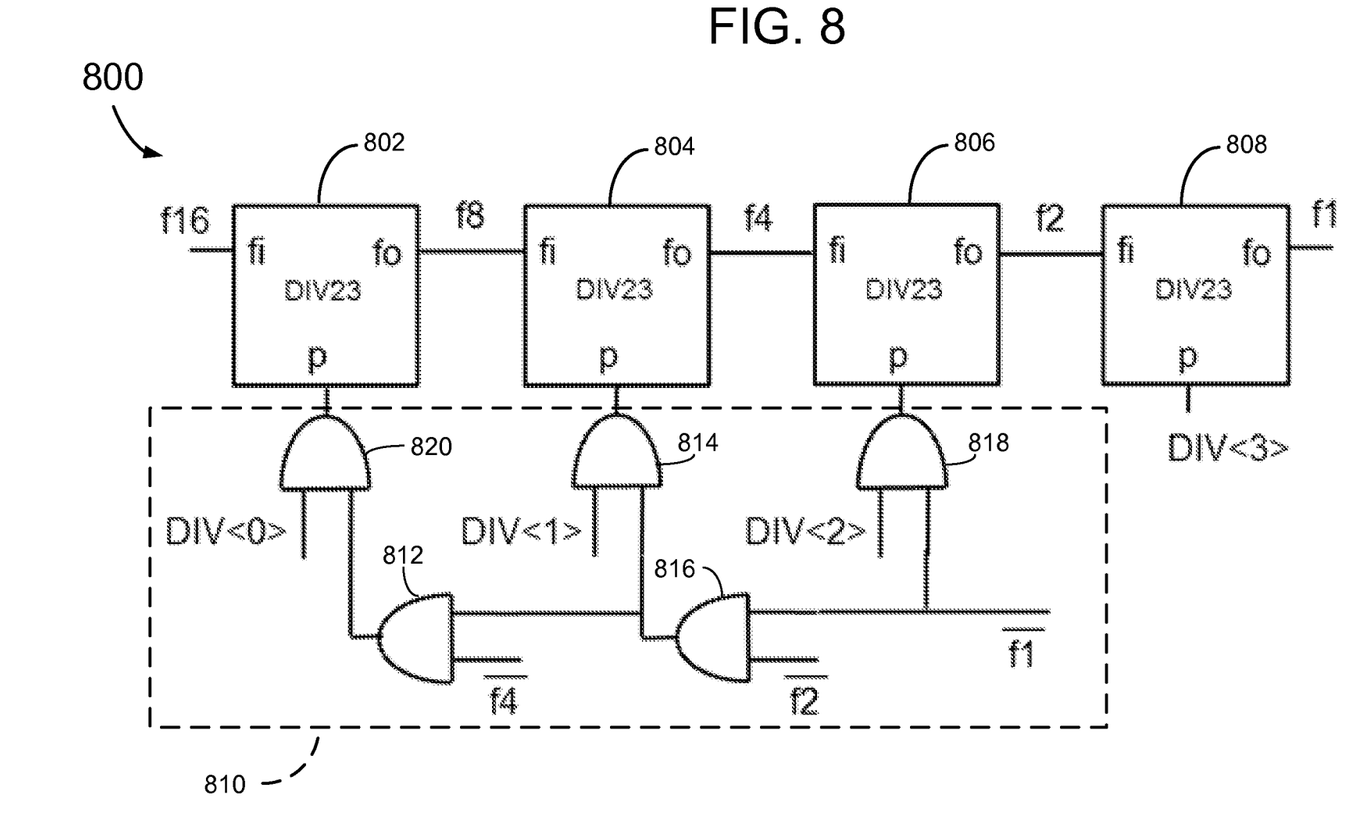
FIG. 8 shows an alternative embodiment of a prescaler similar to that shown in FIG. 6.

FIG. 8 illustrates an alternative multi-modulus prescaler, generally designated 800, that takes the form of a 4-bit prescaler based on similar concepts to those described above. The multi-modulus prescaler 800 includes four divider components 802, 804, 806 and 808 disposed in a cascaded manner, similar to the architecture of FIG. 6. In one specific embodiment, each of the component dividers is embodied as a divide-by-⅔ divider.

Further referring to FIG. 8, the multi-modulus prescaler 800 includes control logic 810 in the form of a sequence of cascaded AND gates 812, 814, 816, 818 and 820 to provide appropriately gated control signals DIV<3>, DIV<2>, DIV<1> and DIV<0> to the control inputs p of the divider components. The control signals are generated as a 4-bit control word by a programmable counter, similar to the counter structures described above in prior embodiments. A most significant bit DIV<3> of the control word is fed directly to the control input p of the last divider component 808. The next significant bit DIV<2> is ANDed by AND gate 818 along with the complement of the output f1 of the last divider component 808. AND gate 816 receives as its inputs the complements to both output signals f1 and f2, and provides its output for ANDing with the control bit DIV<1> to AND gate 814. The output from gate 816 is ANDed with the output signal f4 by gate 812, and the resulting output fed to AND gate 810 along with control bit DIV<0>. Scaling the multi-modulus prescaler 800 to N bits is straightforward. Gating of the control bits with the appropriate combination of the complements of clocks f1, f2 and f4 enables proper sampling of the control bit at the rising edge of the output clock f1. Each DIV23 block can delay the positive edge of its output by one period of its input clock according to if it divides by 3 or not. One clock period of f16 is one VCO period T, one period of f8 is 2T, one period of f4 is 4 T and of f2 is 8T. The divider can delay its output f1 compared to the divide by 16 operation by any number of VCO periods T between 0 and 15 (can swallow any number of VCO periods between 0 and 15), thus implementing any divisor from 16 to 31, by selectively dividing by 3 in certain of the DIV23 blocks. For example, to divide by 25, the divider must swallow 9 VCO periods and the control word bust be set to DIV<3:0>=1001. Then stage 808 will swallow 8 VCO periods and stage 802 1 VCO period for a total of 9 VCO periods.

Figure 9:
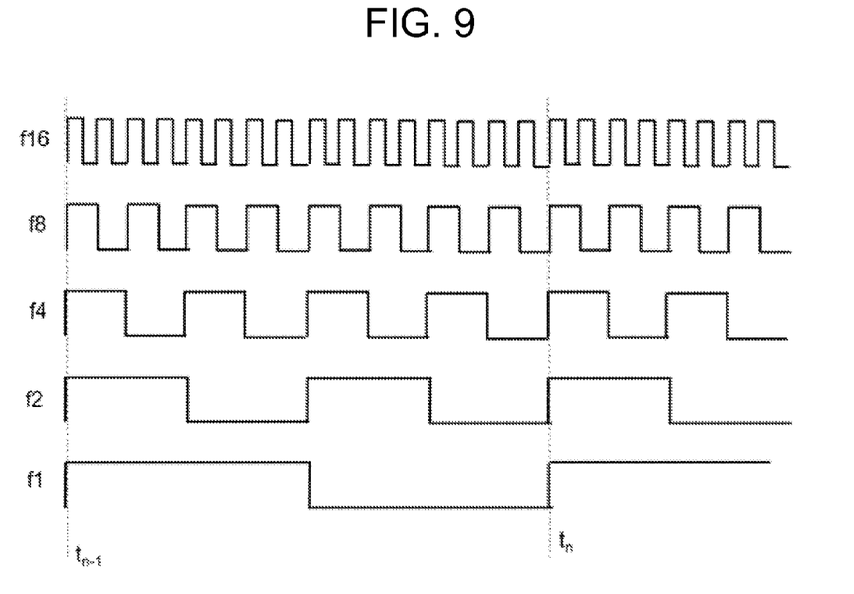
FIG. 9 illustrates a timing chart for various signals associated with the prescaler of FIG. 8.

FIG. 9 illustrates the timing involved with the circuit of FIG. 8, including the respective outputs f16, f8, f4, f2 and f1 that are also used by the control logic in developing the various control signals. For simplicity, all DIV23 blocks are shown operating as divide-by-2 blocks, such that no pulse swallowing takes place. In operation, each DIV23 circuit of FIG. 8 can read a non-zero value of its programmed input p at each rising edge of its input clock right before which the output of the DIV23 is low, or equivalently at each rising edge of its output clock. For all stages, except for the last stage 808, this condition is satisfied in more than one time instants within the division period (a period of the output clock f1). By ANDing the programming value DIV<i> of a certain DIV23 stage with the complements of the outputs of all the lower frequency DIV23 blocks, non-zero programming values DIV<K−1:0> can only be sampled at the rising edge of the final output clock, f1, time instants $t_{n-1}$ and $t_n$ in FIGS. 8 and 9. For example for the DIV23 block that generates f8, its programming input p is generated by ANDing DIV<0> with the complements of f4, f2 and f1.

Notice that the propagation delay through the cascaded AND gates employed by the control logic 810 of FIG. 8 does not represent a problem because the more gates a signal propagates the lower its frequency and therefore the longer time it remains stable before it is being used to gate the programming input of a DIV23 block with higher frequency output. Also notice that since the DIV23 blocks are cascaded similarly to a ripple counter, the higher frequency clocks toggle first and their output change triggers the lower frequency stages to toggle. Therefore all lower frequency clocks used by logic 810 to generate the programming input of a certain stage, are stable sufficiently long enough before the programming input is sampled.

Straightforward modifications may be made to the proposed circuits to make them capable of operating at higher frequencies. For example the AND gate that ANDs each DIV<i> signal in FIG. 8 with the combination of the outputs of the lower frequency stages can be merged with the gate where input p is connected to inside the DIV⅔ circuit. This gate in turn may be merged with corresponding flip flop.

Those skilled in the art will appreciate the benefits and advantages afforded by the embodiments described herein. By controlling the pulse sequencing of the frequency divider to generate only a single non-divide-by-N pulse as early as possible in the division period, linearity in the sigma-delta modulation may be enhanced while minimizing the detrimental effect of the quantization noise.

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

The invention claimed is:

1. A frequency divider for dividing a frequency of an oscillation signal, comprising:
a first input to receive an input clock signal CKin;
a second input to receive a digital representation of a frequency division ratio D, wherein D is an integer;
an output to generate an output clock signal CKout;
a multi-modulus prescaler to perform frequency division by a modulus M, wherein M is an integer between N and 2*N−1 and N is a power of 2, the multi-modulus prescaler comprising:
a first input to receive CKin;
a second input to receive a digital representation of M; and
an output to generate an output clock signal CKpr, wherein a frequency of CKpr is lower than a frequency of CKin;
wherein:
the multi-modulus prescaler to generate a first edge of CKpr triggered by a first edge of CKin;
the multi-modulus prescaler to sample the digital representation of M from the second input of the multi-modulus prescaler with each edge of CKin that triggers an edge of CKpr; and
the multi-modulus prescaler to use the sampled value of M to generate a second edge of CKpr with the M-th edge of CKin after the first edge of CKin;
a programmable counter, comprising:
a first input coupled to the multi-modulus prescaler to receive CKpr;
a second input to receive the digital representation of D;
a first output to generate an output clock signal CKouti, wherein a frequency of CKouti is lower than the frequency of CKin; and
a second output coupled to the multi-modulus prescaler and to generate the digital representation of M;
wherein:
the counter to sample the digital representation of D from the second input of the frequency divider with a first edge of CKpr;

the counter to use the sampled value of D to sample the next value of D with an edge of CKpr D\N edges after the first, wherein D\N equals an integer portion of D divided by N;

the counter to output the digital representation of M with each edge of CKpr;

wherein:

M equals N plus D minus D\N for each edge of CKpr wherein the counter samples the digital representation of D; and M equals N for each subsequent edge of CKpr wherein the counter does not sample the digital representation of D.

2. The frequency divider of claim 1, further comprising a first power supply input for the prescaler and a second power supply input for the counter, wherein a power supply for the first power supply input differs from a power supply for the second power supply input.

3. The frequency divider of claim 1, wherein:
the counter further to generate an edge of CKouti with each edge of CKpr that samples the digital representation of D from the second input of the frequency divider, and wherein CKout equals CKouti.

4. The frequency divider of claim 1, wherein:
the counter further to generate an edge of CKouti with each edge of CKpr that follows an edge of CKpr that samples the digital representation of D from the second input of the frequency divider; and
CKout equals CKouti.

5. The frequency divider of claim 1, further comprising a retiming flip flop, comprising:
a data input coupled to the counter and to receive CKouti;
a clock input coupled to the multi-modulus prescaler and to receive CKpr; and
an output to output CKout;
wherein CKout is a delay signal of CKouti by approximately a period of CKpr.

6. The frequency divider of claim 5, wherein:
the counter further to generate an edge of CKouti with the edge of CKpr preceding the edge of CKpr that samples the digital representation of D from the second input of the frequency divider; and
the counter further to generate an edge of CKout with each edge of CKpr that samples the digital representation of D from the second input of the frequency divider.

7. The frequency divider of claim 6, further comprising a first power supply input for the counter and a second power supply input for at least one of the prescaler and the retiming flip flop, wherein a power supply for the first power supply input differs from a power supply for the second power supply input.

8. The frequency divider of claim 5, wherein:
the counter further to generate an edge of CKouti with the edge of CKpr that samples the digital representation of D from the second input of the frequency divider; and
the counter further to generate an edge of CKout with each edge of CKpr that follows the edge of CKpr that samples the digital representation of D from the second input of the frequency divider.

9. The frequency divider of claim 8, further comprising a first power supply input for the counter and a second power supply input for at least one of the prescaler and the retiming flip flop, wherein a power supply for the first power supply input differs from a power supply for the second power supply input.

10. The frequency divider of claim 1, wherein the multi-modulus prescaler further comprises:

a first divide-by ⅔ circuit, comprising:
a clock input coupled to the first input of the multi-modulus prescaler;
a programmable input; and
a clock output;
wherein the first divide-by ⅔ circuit:
divides the frequency of the signal of the clock input by two and outputs the frequency divided signal on the clock output when the programmable input is a first value; and
divides the frequency of the signal of the clock input by three and outputs the frequency divided signal on the clock output when the programmable input is a second value; and a second divide-by ⅔ circuit, comprising:
a clock input coupled to the clock output of the first divide-by ⅔ circuit;
a programmable input; and
a clock output coupled to the output of the multi-modulus prescaler;
wherein the second divide-by ⅔ circuit:
divides the frequency of the signal of the clock input by two and outputs the frequency divided signal on the clock output when the programmable input is a first value; and
divides the frequency of the signal of the clock input by three and outputs the frequency divided signal on the clock output when the programmable input is a second value.

11. The frequency divider of claim 1, wherein the multi-modulus prescaler further comprises a plurality of cascaded divide-by ⅔ circuits, including a first divide-by ⅔ circuit and a last divide-by ⅔ circuit, wherein:

the first divide-by ⅔ circuit comprises:
a clock input coupled to the first input of the multi-modulus prescaler;
a programmable input; and
a clock output;
wherein the first divide-by ⅔ circuit:
divides the frequency of the signal of the clock input by two and outputs the frequency divided signal on the clock output when the programmable input is a first value; and
divides the frequency of the signal of the clock input by three and outputs the frequency divided signal on the clock output when the programmable input is a second value;

the last divide-by ⅔ circuit, comprising:
a clock input coupled to the clock output of a divide-by ⅔ circuit in the cascaded divide-by ⅔ circuits;
a programmable input; and
a clock output coupled to the output of the multi-modulus prescaler;
wherein the last divide-by ⅔ circuit:
divides the frequency of the signal of the clock input by two and outputs the frequency divided signal on the clock output when the programmable input is a first value; and
divides the frequency of the signal of the clock input by three and outputs the frequency divided signal on the clock output when the programmable input is a second value.

12. The frequency divider of claim 11, wherein the multi-modulus prescaler further comprises a logic coupled to the second input of the multi-modulus prescaler to:
receive a clock output from each divide-by ⅔ circuit in the cascaded divide-by ⅔ circuits; and output a programmable input for each divide-by ⅔ circuit in the cascaded divide-by ⅔ circuits;

wherein for each divide-by ⅔ circuit, a value of the programmable input for the divide-by ⅔ circuit is dependent on the output of all subsequent divide-by ⅔ circuits in the cascaded divide-by ⅔ circuits.

13. The frequency divider of claim 12, wherein for each divide-by ⅔ circuit, the value of the programmable input is a first value when at least one clock output of all subsequent divide-by ⅔ circuits is logic one and one of the first value and a second value when the clock output of all subsequent divide-by ⅔ circuits is logic zero.

14. A fractional-N frequency synthesizer, comprising a frequency divider for dividing a frequency of an oscillation signal, comprising:
a first input to receive an input clock signal CKin;
a second input to receive a digital representation of a frequency division ratio D, wherein D is an integer;
an output to generate an output clock signal CKout;
a multi-modulus prescaler to perform frequency division by a modulus M, wherein M is an integer between N and 2*N−1 and N is a power of 2, the multi-modulus prescaler comprising:
a first input to receive CKin;
a second input to receive a digital representation of M; and
an output to generate an output clock signal CKpr, wherein a frequency of CKpr is lower than a frequency of CKin;
wherein:
the multi-modulus prescaler to generate a first edge of CKpr triggered by a first edge of CKin;
the multi-modulus prescaler to sample the digital representation of M from the second input of the multi-modulus prescaler with each edge of CKin that triggers an edge of CKpr; and
the multi-modulus prescaler to use the sampled value of M to generate a second edge of CKpr with the M-th edge of CKin after the first edge of CKin;
a programmable counter, comprising:
a first input coupled to the multi-modulus prescaler to receive CKpr;
a second input to receive the digital representation of D;
a first output to generate an output clock signal CKouti, wherein a frequency of CKouti is lower than the frequency of CKin; and
a second output coupled to the multi-modulus prescaler and to generate the digital representation of M;
wherein:
the counter to sample the digital representation of D from the second input of the frequency divider with a first edge of CKpr;
the counter to use the sampled value of D to sample the next value of D with an edge of CKpr D\N edges after the first, wherein D\N equals an integer portion of D divided by N;
the counter to output the digital representation of M with each edge of CKpr;
wherein:
M equals N plus D minus D\N for each edge of CKpr wherein the counter samples the digital representation of D; and
M equals N for each subsequent edge of CKpr wherein the counter does not sample the digital representation of D.

15. The fractional-N frequency synthesizer of claim 14, wherein the frequency divider further comprises a first power supply input for the prescaler and a second power supply input for the counter, wherein a power supply for the first power supply input differs from a power supply for the second power supply input.

16. The fractional-N frequency synthesizer of claim 14, wherein the counter of the frequency divider further to generate an edge of CKouti with each edge of CKpr that samples the digital representation of D from the second input of the frequency divider, and wherein CKout equals CKouti.

17. The fractional-N frequency synthesizer of claim 14, wherein:
the counter of the frequency divider further to generate an edge of CKouti with each edge of CKpr that follows an edge of CKpr that samples the digital representation of D from the second input of the frequency divider; and
CKout equals CKouti.

18. The fractional-N frequency synthesizer of claim 14, wherein the frequency divider further comprises a retiming flip flop, comprising:
a data input coupled to the counter and to receive CKouti;
a clock input coupled to the multi-modulus prescaler and to receive CKpr; and
an output to output CKout;
wherein CKout is a delay signal of CKouti by approximately a period of CKpr.

19. The fractional-N frequency synthesizer of claim 18, wherein:
the counter of the frequency divider further to generate an edge of CKouti with the edge of CKpr preceding the edge of CKpr that samples the digital representation of D from the second input of the frequency divider; and
the counter of the frequency divider further to generate an edge of CKout with each edge of CKpr that samples the digital representation of D from the second input of the frequency divider.

20. The fractional-N frequency synthesizer of claim 19, wherein the frequency divider further comprises a first power supply input for the counter and a second power supply input for at least one of the prescaler and the retiming flip flop, wherein a power supply for the first power supply input differs from a power supply for the second power supply input.

21. The fractional-N frequency synthesizer of claim 18, wherein:
the counter of the frequency divider further to generate an edge of CKouti with the edge of CKpr that samples the digital representation of D from the second input of the frequency divider; and
the counter of the frequency divider further to generate an edge of CKout with each edge of CKpr that follows the edge of CKpr that samples the digital representation of D from the second input of the frequency divider.

22. The fractional-N frequency synthesizer of claim 21, wherein the frequency divider further comprises a first power supply input for the counter and a second power supply input for at least one of the prescaler and the retiming flip flop, wherein a power supply for the first power supply input differs from a power supply for the second power supply input.

23. The fractional-N frequency synthesizer of claim 14, wherein the multi-modulus prescaler of the frequency divider further comprises:
a first divide-by ⅔ circuit, comprising:
a clock input coupled to the first input of the multi-modulus prescaler;
a programmable input; and
a clock output;
wherein the first divide-by ⅔ circuit:

divides the frequency of the signal of the clock input by two and outputs the frequency divided signal on the clock output when the programmable input is a first value; and divides the frequency of the signal of the clock input by three and outputs the frequency divided signal on the clock output when the programmable input is a second value; and a second divide-by ⅔ circuit, comprising:
  a clock input coupled to the clock output of the first divide-by ⅔ circuit;
  a programmable input; and
  a clock output coupled to the output of the multi-modulus prescaler;
  wherein the second divide-by ⅔ circuit:
    divides the frequency of the signal of the clock input by two and outputs the frequency divided signal on the clock output when the programmable input is a first value; and
    divides the frequency of the signal of the clock input by three and outputs the frequency divided signal on the clock output when the programmable input is a second value.

24. The fractional-N frequency synthesizer of claim 14, wherein the multi-modulus prescaler of the frequency divider further comprises a plurality of cascaded divide-by ⅔ circuits, including a first divide-by ⅔ circuit and a last divide-by ⅔ circuit, wherein:
  the first divide-by ⅔ circuit comprises:
    a clock input coupled to the first input of the multi-modulus prescaler;
    a programmable input; and
    a clock output;
    wherein the first divide-by ⅔ circuit:
      divides the frequency of the signal of the clock input by two and outputs the frequency divided signal on the clock output when the programmable input is a first value; and
      divides the frequency of the signal of the clock input by three and outputs the frequency divided signal on the clock output when the programmable input is a second value;
  the last divide-by ⅔ circuit, comprising:
    a clock input coupled to the clock output of a divide-by ⅔ circuit in the cascaded divide-by ⅔ circuits;
    a programmable input; and
    a clock output coupled to the output of the multi-modulus prescaler;
    wherein the last divide-by ⅔ circuit:
      divides the frequency of the signal of the clock input by two and outputs the frequency divided signal on the clock output when the programmable input is a first value; and
      divides the frequency of the signal of the clock input by three and outputs the frequency divided signal on the clock output when the programmable input is a second value.

25. The fractional-N frequency synthesizer of claim 24, wherein the multi-modulus prescaler of the frequency divider further comprises a logic coupled to the second input of the multi-modulus prescaler to:
  receive a clock output from each divide-by ⅔ circuit in the cascaded divide-by ⅔ circuits; and
  output a programmable input for each divide-by ⅔ circuit in the cascaded divide-by ⅔ circuits;
  wherein for each divide-by ⅔ circuit, a value of the programmable input for the divide-by ⅔ circuit is dependent on the output of all subsequent divide-by ⅔ circuits in the cascaded divide-by ⅔ circuits.

26. The fractional-N frequency synthesizer of claim 25, wherein for each divide-by ⅔ circuit of the frequency divider, the value of the programmable input is a first value when at least one clock output of all subsequent divide-by ⅔ circuits is logic one and one of the first value and a second value when the clock output of all subsequent divide-by ⅔ circuits is logic zero.

27. A method for dividing a frequency of an oscillation signal, comprising:
  receiving on a first input an input clock signal CKin;
  receiving on a second input a digital representation of a frequency division ratio D, wherein D is an integer;
  generating on an output an output clock signal CKout;
  performing by a multi-modulus prescaler a frequency division by a modulus M, wherein M is an integer between N and 2*N−1 and N is a power of 2, comprising:
    receiving CKin on a first input of the multi-modulus prescaler;
    receiving a digital representation of M on a second input of the multi-modulus prescaler; and
    generating an output clock signal CKpr on an output of the multi-modulus prescaler, wherein a frequency of CKpr is lower than a frequency of CKin;
    wherein:
      the multi-modulus prescaler to generate a first edge of CKpr triggered by a first edge of CKin;
      the multi-modulus prescaler to sample the digital representation of M from the second input of the multi-modulus prescaler with each edge of CKin that triggers an edge of CKpr; and
      the multi-modulus prescaler to use the sampled value of M to generate a second edge of CKpr with the M-th edge of CKin after the first edge of CKin; and
  using a programmable counter to output the digital representation of M and an output clock signal CKouti, comprising:
    receiving CKpr on a first input coupled to the multi-modulus prescaler;
    receiving the digital representation of D on a second input;
    generating an output clock signal CKouti on a first output, wherein a frequency of CKouti is lower than the frequency of CKin; and
    generating the digital representation of M on a second output coupled to the multi-modulus prescaler and to generate;
    wherein:
      the counter to sample the digital representation of D from the second input of the frequency divider with a first edge of CKpr;
      the counter to use the sampled value of D to sample the next value of D with an edge of CKpr D\N edges after the first, wherein D\N equals an integer portion of D divided by N;
      the counter to output the digital representation of M with each edge of CKpr;
    wherein:
      M equals N plus D minus D\N for each edge of CKpr wherein the counter samples the digital representation of D; and
      M equals N for each subsequent edge of CKpr wherein the counter does not sample the digital representation of D.

28. The method of claim 27, further comprising using a first power supply for the prescaler and a second power supply for the counter.

29. The method of claim 27, wherein the counter further to generate an edge of CKouti with each edge of CKpr that samples the digital representation of D from the second input of the frequency divider, and wherein CKout equals CKouti.

30. The method of claim 27, wherein:
the counter further to generate an edge of CKouti with each edge of CKpr that follows an edge of CKpr that samples the digital representation of D from the second input of the frequency divider; and
CKout equals CKouti.

31. The method of claim 27, further comprising using a retiming flip flop to delay CKouti to generate CKout, comprising:
receiving CKouti on a data input of the counter;
receiving CKpr on a clock input of the counter; and
outputting CKout on an output;
wherein CKout is a delay signal of CKouti by approximately a period of CKpr.

32. The method of claim 31, wherein:
the counter further to generate an edge of CKouti with the edge of CKpr preceding the edge of CKpr that samples the digital representation of D from the second input of the frequency divider; and
the counter further to generate an edge of CKout with each edge of CKpr that samples the digital representation of D from the second input of the frequency divider.

33. The method of claim 32, further comprising using a first power supply for the counter and a second power supply for at least one of the prescaler and the retiming flip flop.

34. The method of claim 31, wherein:
the counter further to generate an edge of CKouti with the edge of CKpr that samples the digital representation of D from the second input of the frequency divider; and
the counter further to generate an edge of CKout with each edge of CKpr that follows the edge of CKpr that samples the digital representation of D from the second input of the frequency divider.

35. The method of claim 34, further comprising using a first power supply for the counter and a second power supply for at least one of the prescaler and the retiming flip flop.

36. The method of claim 27, further comprising:
using a first divide-by ⅔ circuit including a programmable input to:
divide the frequency of the signal of the first input of the multi-modulus prescaler by two and output the frequency divided signal when the programmable input is a first value; and
divide the frequency of the signal of the first input of the multi-modulus prescaler by three and output the frequency divided signal when the programmable input is a second value; and
using a second divide-by ⅔ circuit including a programmable input to:
divide the frequency of the frequency divided signal of the first divide-by ⅔ circuit by two and output the second divided signal when the programmable input is a first value; and
divide the frequency of the frequency divided signal of the first divide-by ⅔ circuit by three and output the second divided signal when the programmable input is a second value.

37. The method of claim 27, further comprising using a plurality of cascaded divide-by ⅔ circuits to divide the signal on the first input of the multi-modulus prescaler, wherein the multi-modulus prescaler further comprises a plurality of cascaded divide-by ⅔ circuits, wherein:
a first divide-by ⅔ circuit including a programmable input:
divides the frequency of the signal of the first input of the multi-modulus prescaler by two and outputs the frequency divided signal when the programmable input is a first value; and
divides the frequency of the signal of the first input of the multi-modulus prescaler by three and outputs the frequency divided signal when the programmable input is a second value; and
each successive divide-by ⅔ circuit, including a programmable input, of the cascaded divide-by ⅔ circuits:
divides the frequency of the frequency divided signal of the previous divide-by ⅔ circuit and outputs the frequency divided signal when the programmable input is a first value; and
divides the frequency of frequency divided signal of the previous divide-by ⅔ circuit and outputs the frequency divided signal when the programmable input is a second value.

38. The method of claim 37, further comprising using a logic of the multi-modulus prescaler coupled to the second input of the multi-modulus prescaler to:
receive a clock output from each divide-by ⅔ circuit in the cascaded divide-by ⅔ circuits; and
output a programmable input for each divide-by ⅔ circuit in the cascaded divide-by ⅔ circuits;
wherein for each divide-by ⅔ circuit, a value of the programmable input for the divide-by ⅔ circuit is dependent on the output of all subsequent divide-by ⅔ circuits in the cascaded divide-by ⅔ circuits.

39. The method of claim 38, wherein for each divide-by ⅔ circuit, the value of the programmable input is a first value when at least one clock output of all subsequent divide-by ⅔ circuits is logic one and one of the first value and a second value when the clock output of all subsequent divide-by ⅔ circuits is logic zero.

* * * * *